United States Patent [19]

Hashimoto et al.

[11] Patent Number: 5,030,549
[45] Date of Patent: Jul. 9, 1991

[54] FINE PATTERN FORMING METHOD

[75] Inventors: Kazuhiko Hashimoto, Moriguchi; Taichi Koizumi, Osaka; Kenji Kawakita, Neyagawa; Noboru Nomura, Kyoto, all of Japan

[73] Assignee: Matsushita Electric Industrial Co., Ltd., Osaka, Japan

[21] Appl. No.: 371,289

[22] Filed: Jun. 26, 1989

[30] Foreign Application Priority Data

Jun. 29, 1988 [JP] Japan .................. 63-161637

[51] Int. Cl.$^5$ .................. B05D 3/06; G03C 5/00
[52] U.S. Cl. .................. 430/296; 430/311; 430/313; 430/323; 430/325; 430/330
[58] Field of Search .............. 430/296, 311, 313, 323, 430/325, 330

[56] References Cited

U.S. PATENT DOCUMENTS 3,885,076  5/1975  Heidenreich et al. .......... 430/296 X
4,027,052  5/1977  Thompson .................. 430/296

Primary Examiner—Hoa Van Le
Assistant Examiner—Thorl Chea
Attorney, Agent, or Firm—Stevens, Davis, Miller & Mosher

[57] ABSTRACT

Provided is a method for forming fine pattern free from shear of pattern caused by charging and high in dry etch resistance by using a high molecular organic film containing an organometallic complex or a metallic salt in single-layer or multi-layer resist process and treating the surface of this film with a reducing agent to form a metallic layer on the surface.

4 Claims, 7 Drawing Sheets

FIELD BUTTING

FINE PATTERN FORMING METHOD

BACKGROUND OF THE INVENTION

The present invention relates to a fine pattern forming method according to which an optional resist pattern for high accuracy fine processing is formed on a semiconductor substrate by direct writing with electrically charged beams such as electron beam and focused beam using single-layer or multi-layer resist method and more particularly to a fine pattern forming method which is carried out using a high molecular organic film in which an organometallic complex or a metallic salt is incorporated.

Hitherto, in production of IC and LSI, formation of pattern has been carried out by photolithography using ultraviolet rays. With elements becoming finer, it has been tried to enhance NA of stepper lens or to use a light source of short wavelength, but there is the defect that focus depth becomes smaller. Furthermore, for fining of pattern size of LSI device and production of ASIC, electron beam lithography is used. For fine pattern formation by this electron beam lithography, positive type electron beam resists are essential. Among them, polymethyl methacrylate (PMMA) has been known to be highest in resolution, but this has the defect of low sensitivity. Therefore, recently, there have been made many reports to enhance the sensitivity of positive type electron beam resists and there have been proposed positive type electron resists such as, for example, polybutyl methacrylate, a copolymer of methyl methacrylate and methacrylic acid, a copolymer of methacrylic acid and acrylonitrile, a copolymer of methyl methacrylate and isobutylene, polybutene-1-sulfone, polyisopropenyl ketone, and fluoro polymethacrylate. In these resists, scission of principal chain by electron beam can be easily conducted by introducing electron withdrawing group into side chain or by introducing easily decomposable bond into principal chain and thus enhancement of sensitivity is aimed at, but they still do not fully satisfy both the resolution and sensitivity.

Furthermore, electron beam lithography suffers from the problems such as low dry etch resistance of electron beam resists, influence on the pattern accuracy by proximity effect caused by forward scattering and back scattering of electron and influence on pattern writing due to charging of incident electron. For solving these problems, multi-layer resist method according to which action of resist is divided to pattern forming layer and planerizing layer is very effective method. FIG. 6 is a flow sheet which explains tri-layer resist process in electron beam lithography. On a semiconductor substrate 1, an organic film of 2-3 μm is coated as bottom layer 41 for inhibiting proximity effect, then an inorganic film such as $SiO_2$ or SOG (spin on glass) is coated thereon as intermediate layer 42, electron beam resist 43 is coated as a top layer and furthermore, aluminum film 44 is vapor deposited thereon at a thickness of about 100 Å for inhibiting charging [FIG. 6A]. After exposure, aluminum layer 44 is removed with an aqueous alkaline solution, followed by development [FIG. 6B]. Then, dry etching of intermediate layer 42 is performed using the resulting resist pattern as a mask [FIG. 6C]. Then, dry etching of bottom layer 41 is performed using the intermediate layer as a mask [FIG. 6D]. By using the above-mentioned tri-resist process, fine pattern of high aspect ration can be formed. It is possible to carry out a simple double-layer resist process by using a resist possessing the actions of both the top layer and the intermediate layer of the above tri-layer resist. FIGS. 7A-7D are a flow chart which explains the double-layer resist process. An organic film is formed as bottom film 51 and a silicon-containing resist 52 high in dry etch resistance is formed as a top layer [FIG. 7A]. After exposure and development [FIG. 7B], the bottom layer is subjected to dry etching using the top layer resist pattern as a mask [FIG. 7C]. In this way, the double-layer resist process can form fine pattern with higher through-put as compared with tri-layer resist process.

However, the silicon-containing resist high in dry etch resistance which is used in the double-layer resist is mainly negative type and is inferior in resolution owing to swelling caused by development and besides is low in sensitivity and hence cannot be practically used. Especially, due to charging effect, as shown by the surface SEM photograph of FIG. 7D, field butting error occurs to cause breaking of pattern. Such breaking of pattern also occurs in the tri-layer resist if the aluminum thin film is not present. That is, according to the electron beam exposure, area A is scanned with electron beam in the manner as shown by arrow O and then area B is scanned in the manner as shown by arrow P. In this case, if charging occurs, the resist pattern after development is broken (field butting error) between areas A and B. The resist patterns in areas A ad B must essentially be in connected state. Moreover, the tri-layer resist process is much complicated in steps and have many problems such as defect and difficulty in control of pattern size and is difficult to put to practice.

Furthermore, in electron beam lithography, it becomes important to form an image reversal pattern. Therefore, at present, image reversal image is formed by using a negative type electron beam resist or by baking or treatment with ammonia vapor after exposure.

However, negative type resist is low in resolution and it is difficult to form fine resist pattern. Further, formation of image reversal pattern by post-treatment after exposure is apt to be affected by the conditions of the post-treatment and control of pattern size is difficult.

As explained above, the double-layer resist process is a very effective method, but has problems in the resists used. That is, the materials must be high in dry etch resistance and act as a resist. Resists used at present as top layer of double-layer resist include organopolysiloxane or organopolysilane type silicon-containing resists. However, these resists are not so high in both the sensitivity and the resolution and besides are not sufficiently high in dry etch resistance.

When image reversal pattern is formed by electron beam lithography, negative type resist is inferior in resolution due to swelling or formation of whisker during development treatment and sensitivity is also not so high. Formation of reversal pattern by the post-treatment after exposure is affected by the conditions of the post-treatment and control of size of pattern is difficult and besides this reversal pattern can be formed only with specific resists. Furthermore, dry etch resistance of positive type electron beam resist is extremely low and etching of substrate cannot be performed with single-layer electron beam resist.

SUMMARY OF THE INVENTION

The object of the present invention is to provide a method for forming a fine pattern by direct writing with electrically charged beam such as electron beam or focused beam using single-layer or multi-layer resist method, wherein charging by electron or electrically charged particle can be prevented and accurate fine resist pattern can be formed.

According to the method for forming fine pattern of the present invention for attaining the above object, a high molecular organic film containing an organometallic complex or a metallic salt is formed on a substrate and then the organic film is subjected to surface treatment with a reducing agent to form a metallic layer on the surface of the high molecular organic film, whereby optional accurate fine resist pattern free from pattern distortion caused by charging can be obtained.

1—Semiconductor substrate, 2—High molecular organic film, 3—Reducing agent, 4—Metallic layer, 5—Electron beam resist

DESCRIPTION OF THE INVENTION

Figure 1A:
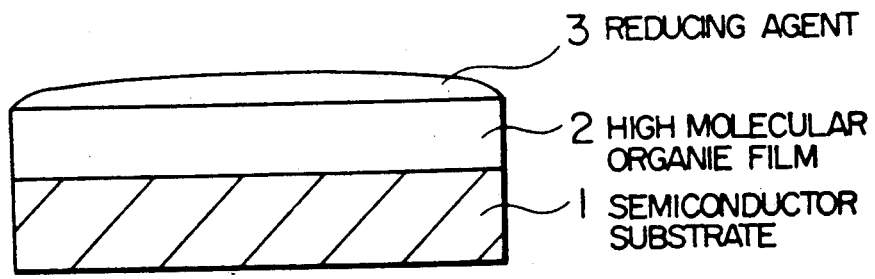
FIGS. 1A-1E are a flow sheet which sectionally shows the first example of the present invention.
Figure 1B:
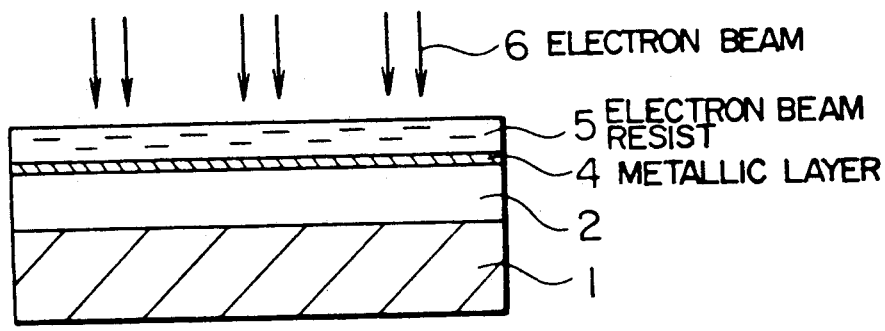
Figure 1C:
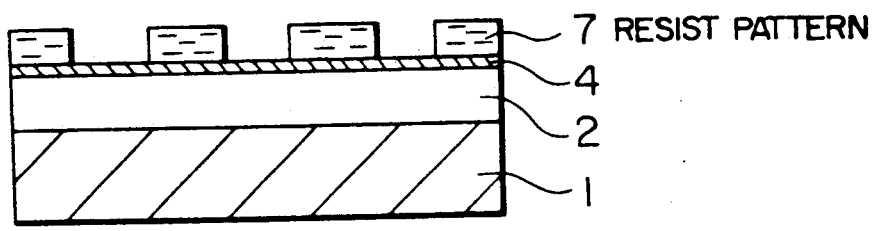
Figure 1D:
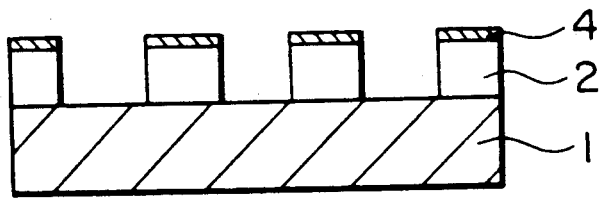
Figure 1E:
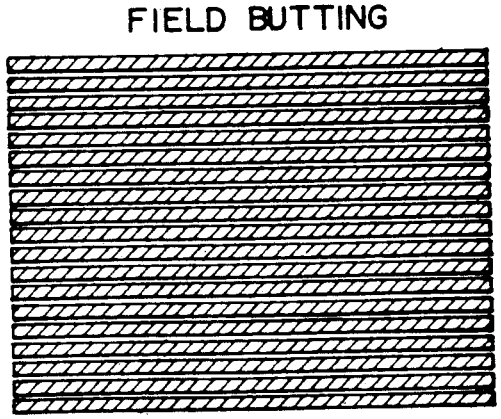

The first example of the present invention is shown in FIGS. 1A-1E. A solution prepared by adding an organo metallic complex or a metallic salt such as NiCl$_2$ (10 in FIGS. 2A-2B) to a polymethyl methacrylate (PMMA) solution is coated on semiconductor substrate 1 and subjected to baking at 170° C. for 30 minutes to form high molecular organic film 2. The surface of this film is treated with a reducing agent [FIG. 1A]. This treatment results in formation of metallic layer 4 on high molecular organic film 2. Fluoro polymethacrylate as electron resist 5 is coated on the metallic layer 4 and is subjected to baking at 140° C. for 30 minutes and then electron beam exposure at an accelerating voltage of 20 KV and a dose of 5 μc/cm$^2$ [FIG. 1B]. Since this metallic layer 4 can prevent charging with electron, accurate fine positive type resist pattern 7 is formed after development [FIG. 1C]. Metallic layer 4 is subjected to etching using this resist pattern as a mask. Then, etching of high molecular organic film 2 can be carried out using this metallic layer as a mask. When etching of the high molecular organic film is carried out with 40 sccm of O$_2$ gas and at a pressure of 1 Pa and a power of 200 W, a selectivity of 100 or higher can be obtained and hence an accurate fine vertical pattern can be obtained [FIG. 1D]. FIG. 1E shows the state of surface in the vicinity of field butting of the pattern observed by SEM. No field butting error is seen and charging effect is not exhibited.

As the metallic salt, CuCl$_2$, CoCl$_2$ and the like can be used in addition to NiCl$_2$. The high molecular organic film may be of any polymer resins besides PMMA. Further, focused ion beam may also be used in place of electron beam.

Figure 2A:
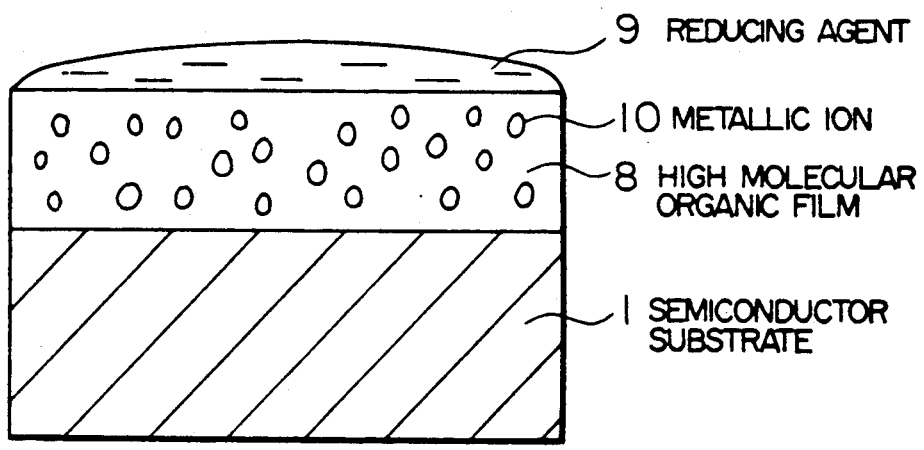
FIGS. 2A-2B show a cross-sectional view which explains the state in which a metallic layer is formed on the surface of the organic film.
Figure 2B:
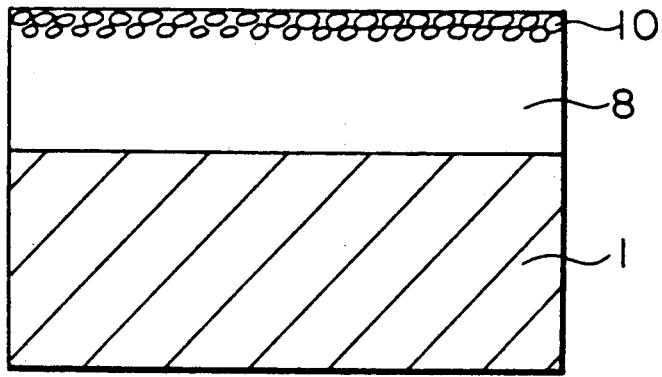
Figure 3A:
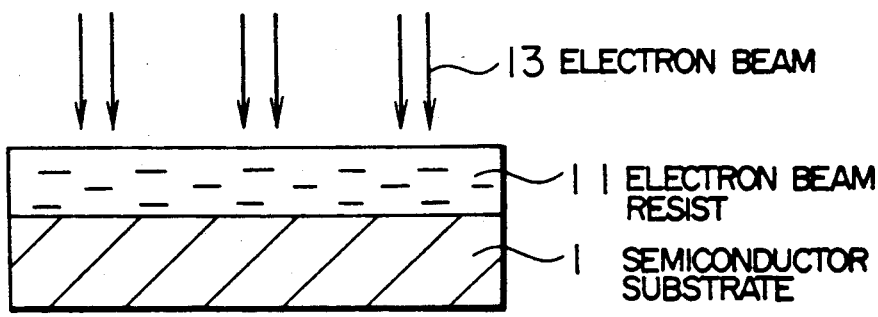
FIGS. 3A-3D are a flow sheet which sectionally shows the second example of the present invention.
Figure 3B:
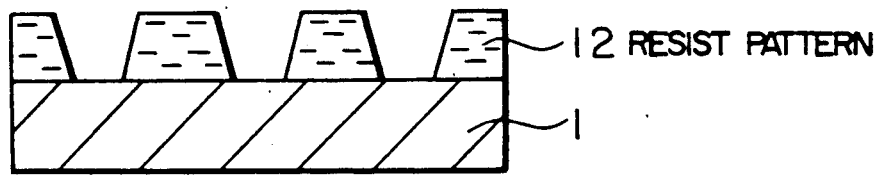
Figure 3C:
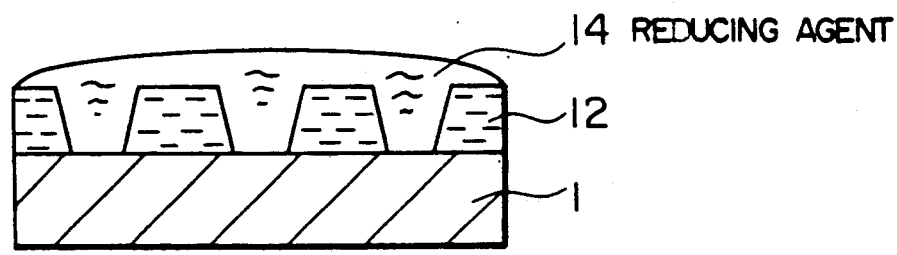
Figure 3D:
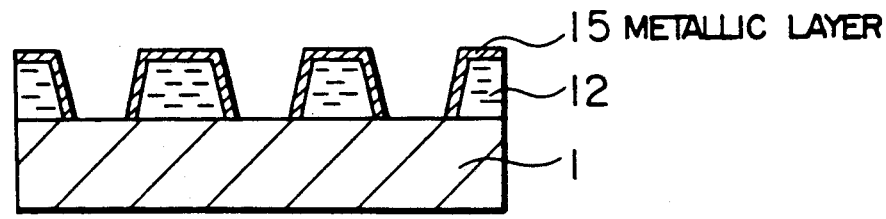
Figure 4A:
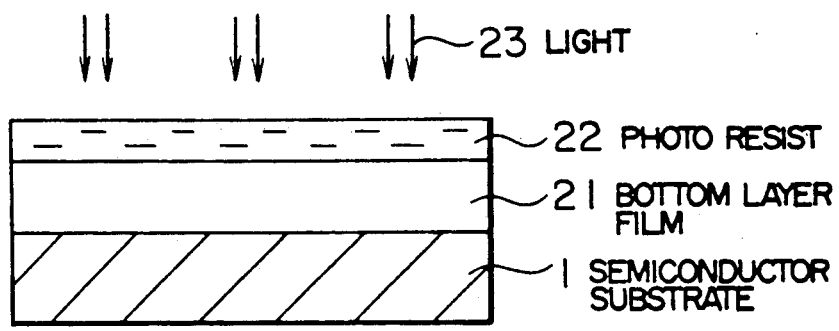
FIGS. 4A-4D are a flow sheet which sectionally shows the third example of the present invention.
Figure 4B:
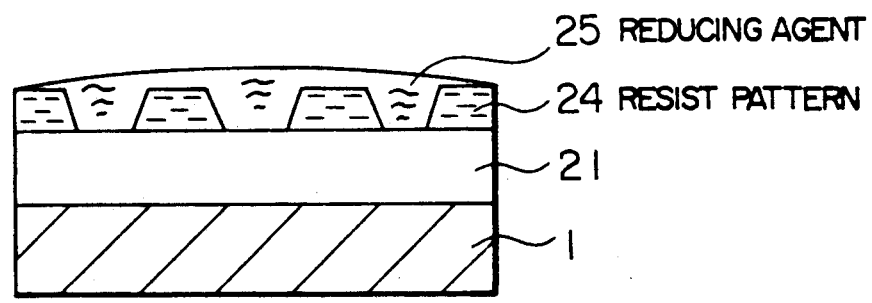
Figure 4C:
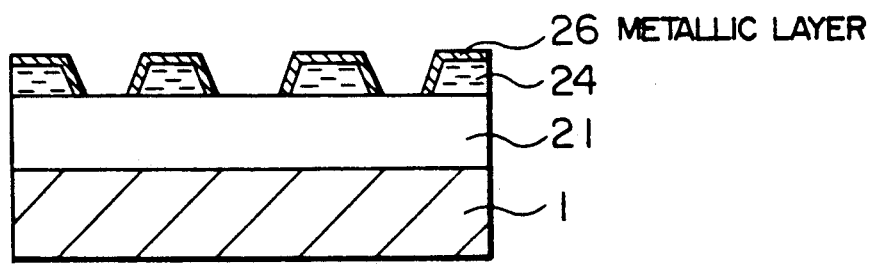
Figure 4D:
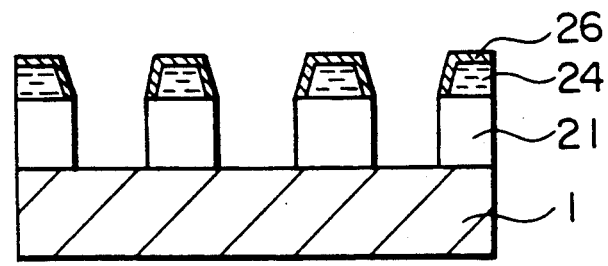
Figure 5A:
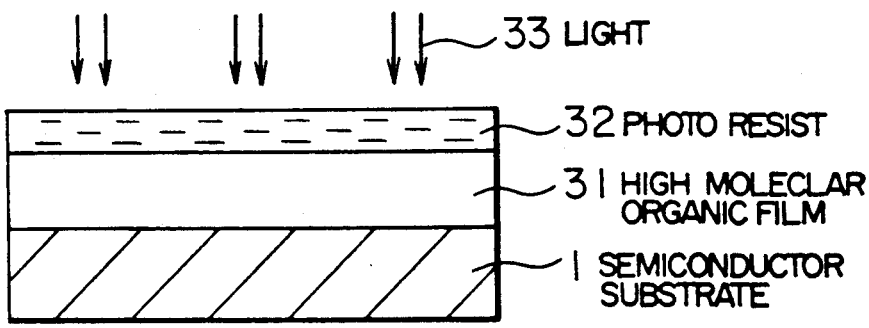
FIGS. 5A-5D are a flow sheet which sectionally shows the fourth example of the present invention.
Figure 5B:
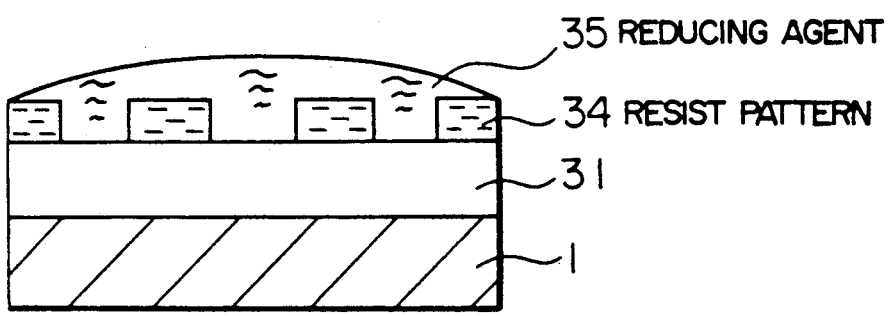
Figure 5C:
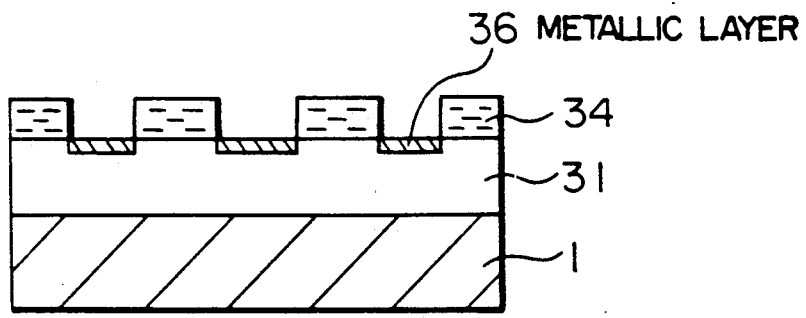
Figure 5D:
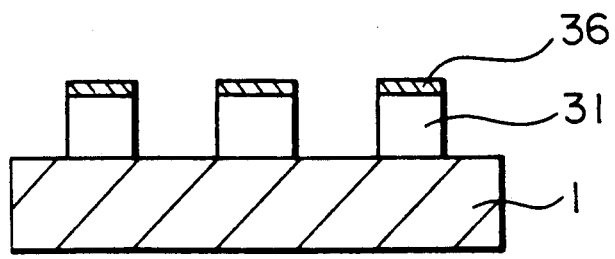
Figure 6A:
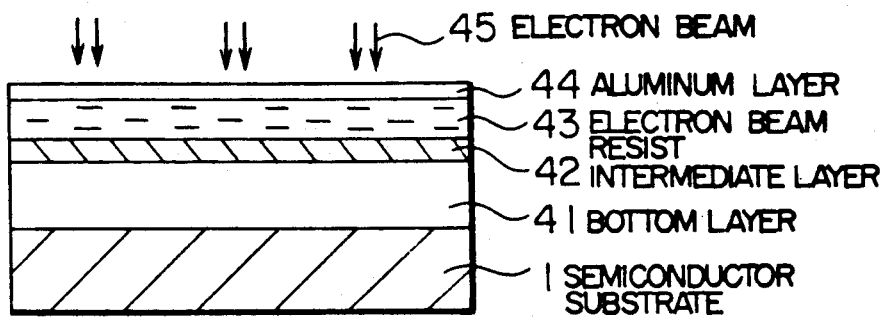
FIGS. 6A-6D are a flow sheet which sectionally shows the conventional tri-layer resist process.
Figure 6B:
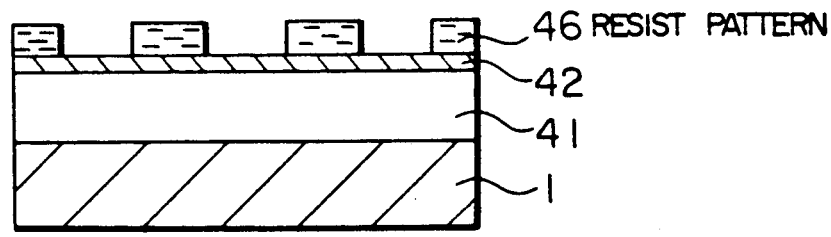
Figure 6C:
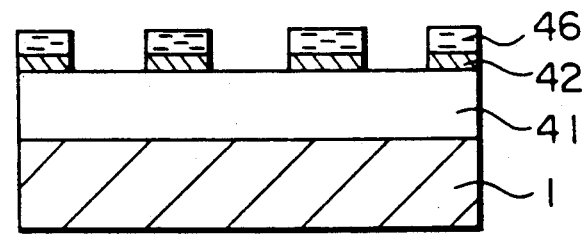
Figure 6D:
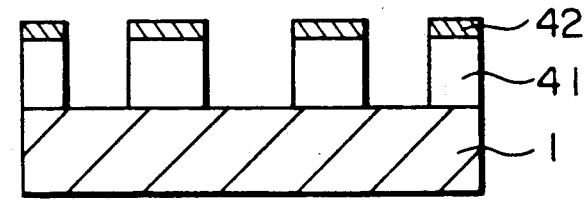
Figure 7A:
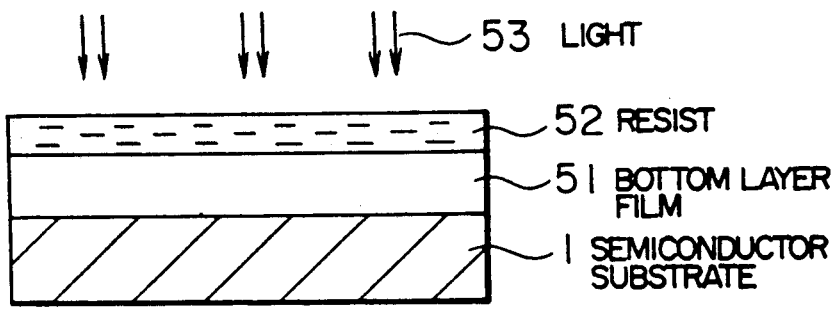
FIGS. 7A-7D are a flow sheet which sectionally shows the conventional double-layer resist process.
Figure 7B:
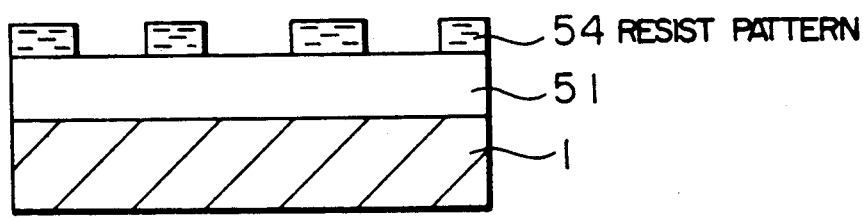
Figure 7C:
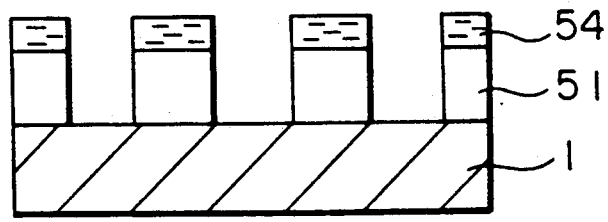
Figure 7D:
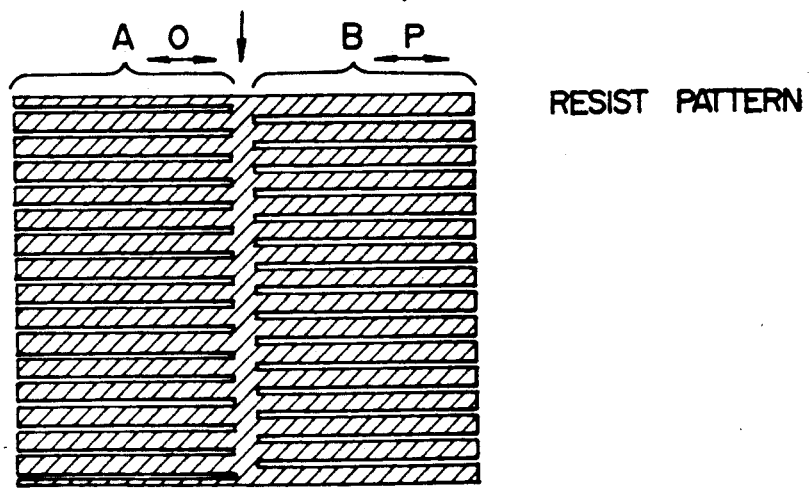

When the high molecular organic film containing organometallic complex or metallic salt is coated and then is surface treated with a reducing agent, a metallic layer is formed on the surface of the high molecular organic film. FIGS. 2A-2B show the state of the metallic layer being formed on the high molecular organic film containing organometallic complex or metallic salt. Metallic ions 10 uniformly distributed in high molecular organic film 8 [FIG. 2A] migrate to the surface of the film, namely, to the side of reducing agent 9 to form a metallic layer of high strength comprising metallic ions 10 concentrated in the surface portion [FIG. 2B]. Therefore, a resist can be coated thereon, followed by exposure. Since surface resistance of this metallic layer is very low, namely, 10 Ω or less, charging which is a problem in electron beam lithography can be prevented. Further, the metallic layer has sufficiently high dry etch resistance to oxygen and so sufficiently acts as a mask in etching of the high molecular organic film of a bottom layer. The resist film comprises only two layers, but has the same action as tri-layer resist and besides, vapor deposition of metal is not needed and charging can be prevented. According to this method, fine resist pattern can be simply formed using conventional resist.

Next, the second example of the present invention is shown in FIGS. 3A-3D. A solution prepared by incorporating an organometallic complex or a metallic salt such as CoCl$_2$ in PMMA solution is coated on semiconductor substrate 1 and is subjected to baking at 170° C. for 30 minutes to form electron beam resist 11 [FIG. 3A]. This is subjected to an exposure with electron beam at an accelerating voltage of 20 KV and a dose of 100 μc/cm$^2$ or an exposure using DVV and then is developed with a mixed solution of methyl isobutyl ketone (MIBK) and isopropyl alcohol (IPA) to obtain resist pattern 12 [FIG. 3B]. Reducing agent 14 is dropped on the resist pattern 12 to carry out surface treatment [FIG. 3C] to form a metallic layer on the surface of the resist pattern [FIG. 3D]. This surface metallic layer improves dry etch resistance of the resist pattern and the substrate can be subjected to etching with a single layer resist. Thus, resist pattern of high dry etch resistance and high heat resistance can be formed.

By using a resist containing an organometallic complex or a metallic salt, dry etch resistance of a resist poor in dry etch resistance can be improved. A resist containing an organometallic complex or a metallic salt is coated and subjected to exposure and development and then to surface treatment with a reducing agent. By this surface treatment, a metallic layer is formed on the surface of the resist pattern and thus a resist pattern of high dry etch resistance can be formed. According to this procedure, a substrate can be subjected to accurate etching even with electron beam single resist layer poor in dry etch resistance. Resistance of this resist film is 10$^6$ Ω or less and shear of pattern caused by charging at writing can be prevented and accurate resist pattern can be formed.

Next, the third example of the present invention is shown in FIGS. 4A-4D. Bottom layer film 21 is coated on semiconductor substrate 1 and is subjected to baking at 200° C., for 30 minutes. Photoresist 22 containing an organometallic complex or a metallic salt such as CuCl$_2$ is coated thereon and subjected to baking at 100° C. for 30 minutes to form a resist film of 0.5 μm thick [FIG.

4A]. After exposure, development is carried out with an aqueous alkali solution to obtain resist pattern 24. Reducing agent 25 is dropped on this resist pattern to perform surface treatment [FIG. 4B] to form metallic layer 26 on the surface of the resist pattern [FIG. 4C]. Since this metallic layer undergoes substantially no etching with oxygen, dry etching of bottom layer film 21 can be carried out using this resist pattern as a mask. When etching of the bottom layer film is carried out with 40 sccm of $O_2$ gas and at a pressure of 1 Pa and a power of 100 W, a selectivity of 100 or higher can be obtained and so accurate fine vertical pattern can be formed [FIG. 4D].

Next, the fourth example of the present invention is shown in FIGS. 5A–5D. A PMMA solution containing an organometallic complex or a metallic salt is coated on semiconductor substrate 1 and is baked at 170° C. for 30 minutes to form high molecular organic film 31. Photo resist 32 is spin coated thereon and is baked at 100° C. for 30 minutes to form a resist layer [FIG. 5A]. Resist pattern 34 is formed by exposure and development. Reducing agent 35 is dropped on this resist pattern to carry out surface treatment of bottom layer high molecular organic film 31 [FIG. 5B]. Metallic layer 36 is formed by reducing agent 35 on the surface of the area where no resist pattern 34 is present [FIG. 5C]. Since this metallic layer 36 undergoes substantially no etching with oxygen, dry etching of top layer resist 34 and bottom layer high molecular organic film 31 can be performed using this metallic layer 36 as a mask. When etching of the bottom layer film is effected with 60 sccm of $O_2$ and at a pressure of 1 Pa and a power of 200 W, a selectivity of 100 or higher of selectivity can be obtained and hence accurate and fine image reversal vertical pattern can be formed [FIG. 5D].

According to the present invention, fine resist pattern can be easily formed by a resist process which uses the above-mentioned high molecular organic film containing an organometallic complex or a metallic salt. Especially, even a double-layer resist process serves as in-situ tri-layer resist process which has the same function as tri-layer resist process and besides charging with electron can be prevented and accurate fine pattern can be formed. Furthermore, by using double-layer resist, image reversal resist pattern can be easily formed and since the pattern is formed by dry etching, size controllability of pattern is superior. Moreover, dry etch resistance of electron beam resist poor in dry etch resistance can be improved and fine pattern superior in size controllability and reproducibility and high in resolution can be formed. Therefore, the present invention is effective for formation of fine pattern with high resolution and high accuracy.

As explained above, according to the present invention, by surface treating a high molecular organic film containing an organometallic complex or a metallic salt with a reducing agent, a metallic layer can be easily formed on the surface of the high molecular organic film and by applying this reaction to single-layer or double-layer resist, fine pattern of high dry etch resistance can be formed. By using the high molecular organic film as a bottom layer film of double-layer resist process, a metallic layer can be easily formed to act as an in-situ tri-layer resist and besides, charging with electron can be prevented. Furthermore, image reversal vertical resist pattern can be easily and accurately formed by the treatment with a reducing agent after top layer resist patterning. In addition, resist pattern of high dry etch resistance can be formed by using the organic film as single-layer resist or top layer resist of double-layer resist. By using these methods, it has become possible to use double-layer process or single-layer resist process in place of tri-resist process which has been practised with difficulty and accurate and vertical fine pattern of high dry etch resistance can be obtained. Thus, the present invention makes a great contribution to production of super high density integrated circuits.

What is claimed is:

1. A method for forming a fine pattern which comprises the steps of coating an organic polymer solution containing an organometallic complex or a metallic salt selected from the group consisting of $NiCl_2$, $CuCl_2$, and $CoCl_2$ on a semiconductor substrate, heat treating the solution and then treating the resulting high molecular organic film with a reducing agent to form a metallic layer in a surface portion of the film; coating a resist on said film and heat treating the resist; writing a pattern on the resulting resist film and developing the pattern; and subjecting said high molecular organic film to etching using said resist pattern as a mask.

2. A method for forming fine pattern which comprises the steps of coating a resist solution containing an organometallic complex or a metallic salt selected from the group consisting of $NiCl_2$, $CuCl_2$ and $CoCl_2$ on a semiconductor substrate and heat treating the resulting resist film; and writing a pattern on said resist film, developing the pattern and then treating the pattern with a reducing agent to form a metallic layer in a surface portion of the film.

3. A method for forming fine pattern which comprises the steps of coating a high molecular organic film on a semiconductor substrate and heat treating the film; coating a resist solution containing an organometallic complex or a metallic salt selected from the group consisting of $NiCl_2$, $CuCl_2$ and $CoCl_2$ on said high molecular organic film and heat treating the film; writing a pattern on said resist film, developing the pattern and then treating the pattern with a reducing agent to form a metallic layer in a surface portion of the film; and subjecting said high molecular organic film to etching using said resist pattern as a mask.

4. A method for forming fine pattern which comprises the steps of coating an organic polymer solution containing an organometallic complex or a metallic salt selected from the group consisting of $NiCl_2$, $CuCl_2$ and $CoCl_2$ on a semiconductor substrate and heat treating the resulting high molecular organic film; coating on the high molecular organic film a resist and heat treating the resist film; writing a pattern on this resist pattern, developing the pattern and then treating the pattern with a reducing agent to form a metallic layer in the surface portion of the film; and subjecting said resist pattern and said high molecular organic film to etching.

* * * * *